United States Patent
Yamamoto

(10) Patent No.: US 6,603,131 B2
(45) Date of Patent: Aug. 5, 2003

(54) CHARGED-PARTICLE-BEAM OPTICAL SYSTEMS AND MICROLITHOGRAPHY APPARATUS COMPRISING A NON-ABSORBING SHAPING APERTURE

(75) Inventor: Hajime Yamamoto, Kawasaki (JP)

(73) Assignee: Nikon Corporation, Tokyo (JP)

( * ) Notice: Subject to any disclaimer, the term of this patent is extended or adjusted under 35 U.S.C. 154(b) by 12 days.

(21) Appl. No.: 09/790,194

(22) Filed: Feb. 20, 2001

(65) Prior Publication Data

US 2001/0016299 A1 Aug. 23, 2001

(30) Foreign Application Priority Data

Feb. 23, 2000 (JP) ........................................ 2000-045811

(51) Int. Cl.$^7$ ............................. A61N 5/00; G21G 5/00; G21K 5/10; H01J 37/08; G01K 1/08
(52) U.S. Cl. ................... 250/492.1; 250/492.2; 250/492.22; 250/492.23; 250/398; 250/396 R
(58) Field of Search ................ 250/396 R, 492.1, 250/492.2, 492.22, 492.23, 398

(56) References Cited

U.S. PATENT DOCUMENTS

| | | | | |
|---|---|---|---|---|
| 3,995,954 A | * | 12/1976 | Dir et al. ............... | 355/71 |
| 5,455,427 A | * | 10/1995 | Lepselter et al. ....... | 250/492.23 |
| 5,932,884 A | * | 8/1999 | Aizaki .................. | 250/492.23 |
| 6,218,676 B1 | * | 4/2001 | Nakasuji ................ | 250/396 R |
| 6,326,634 B1 | * | 12/2001 | Robinson ................ | 250/505.1 |
| 6,429,441 B1 | * | 8/2002 | Nakasuji ................ | 250/397 |
| 6,433,347 B1 | * | 8/2002 | Suzuki ................. | 250/396 ML |
| 6,437,352 B1 | * | 8/2002 | Gordon ................. | 250/398 |
| 6,452,193 B1 | * | 9/2002 | Goto ................... | 250/491.1 |
| 6,541,783 B1 | * | 4/2003 | Robinson et al. ....... | 250/492.23 |

* cited by examiner

*Primary Examiner*—John R. Lee
*Assistant Examiner*—Mary El-Shammaa
(74) *Attorney, Agent, or Firm*—Klarquist Sparkman LLP

(57) ABSTRACT

Charged-particle-beam (CPB) optical systems, and CPB microlithography apparatus including CPB optical systems, are disclosed that include a "shaping aperture" that absorbs a very low percentage of incident charged particles and hence does not experience excessive temperature increases due to bombardment by and absorption of incident charged particles. Nevertheless, the shaping apertures are effective for trimming and shaping a charged particle beam to produce a downstream-propagating beam having a desired transverse profile. The aperture opening in the shaping aperture is defined in a conductive thin-film membrane. The membrane thickness is configured to cause charged particles incident on the membrane to experience scattering (e.g., forward-scattering). CPB optical systems including the shaping aperture also include a "screening aperture" downstream of the shaping aperture to block (absorb) scattered charged particles. The screening aperture is made from a relatively thick conductive sheet and is situated where the shaped beam forms a crossover downstream of the shaping aperture.

21 Claims, 2 Drawing Sheets

CHARGED-PARTICLE-BEAM OPTICAL SYSTEMS AND MICROLITHOGRAPHY APPARATUS COMPRISING A NON-ABSORBING SHAPING APERTURE

FIELD OF THE INVENTION

This invention pertains to charged-particle-beam (CPB) "optical" systems as used, for example, in CPB microlithography apparatus. Microlithography is a key technique used in the manufacture of microelectronic devices such as semiconductor integrated circuits, displays, and the like. More specifically, the invention pertains to CPB optical systems comprising at least one aperture serving to "trim" or shape the charged particle beam as the beam passes through an opening defined by the aperture by absorption of outlying particles of the beam.

BACKGROUND OF THE INVENTION

Conventional charged-particle-beam (CPB) optical systems typically include at least one "shaping aperture" constructed of an aperture plate defining an opening through which the charged particle beam passes. The opening is sized such that, as the beam passes through the opening, peripheral regions of the transverse profile of the beam are clipped by respective edges of the opening. Hence, shaping apertures generally are used, for example, for trimming the beam, shaping the transverse profile of the beam, or aligning the beam.

Conventionally, the aperture plate of a shaping aperture is fabricated from a sheet of metal (e.g., molybdenum) having a thickness sufficient to absorb the charged particles of the clipped portions of the beam. This absorption causes heating of the aperture plate. Excessive heating results in distortion and/or damage to the aperture plate, which causes undesired changes in the size and/or geometry of the opening. The heating also can extend to neighboring structural components that can be deformed or damaged by the heat. For example, elastomeric O-rings located near the aperture can be deformed or damaged from heat.

The conventional approach to the problem of heating of the shaping aperture is to cool the aperture plate actively, such as by circulating a heat-exchange fluid through passages in the aperture plate and surrounding structures. Unfortunately, this approach results in substantial apparatus complexity and cost.

SUMMARY OF THE INVENTION

In view of the shortcomings of conventional apparatus as summarized above, an object of the invention is to provide charged-particle-beam (CPB) optical systems including a beam-trimming and/or profile-shaping aperture (termed generally herein a "shaping aperture") exhibiting substantially reduced absorption of incident charged particles compared to conventional systems. Another object is to provide CPB optical systems including at least one shaping aperture that exhibits substantially less heating during normal operation than conventional systems. Yet another object is to provide CPB optical systems (including at least one shaping aperture) having less complexity and lower cost, compared to conventional systems, without compromising performance. Yet another object is to provide CPB optical systems in which temperature control of the shaping aperture(s) and neighboring components is significantly easier to achieve, compared to conventional systems.

To such ends, and according to a first aspect of the invention, CPB optical systems are provided. An embodiment of such a system comprises a shaping aperture and a screening aperture. The shaping aperture is situated and configured to receive a beam of charged particles propagating along an optical axis from a CPB source. The shaping aperture comprises a conductive thin-film membrane defining an aperture opening that transmits at least a portion of the beam incident on the shaping aperture. The thin-film membrane is configured to scatter the charged particles of the beam incident on the membrane without absorbing the incident charged particles, so as to form a shaped beam propagating downstream of the shaping aperture. The screening aperture is situated downstream of the shaping aperture at a location at which the shaped beam forms a crossover. The screening aperture comprises a conductive sheet defining an aperture opening having a width dimension corresponding to a width dimension of the crossover. The conductive sheet is sufficiently thick in an optical-axis direction so as to absorb charged particles incident on the sheet.

By configuring the shaping aperture using a conductive thin-film membrane, the current of absorbed charged particles of the incident beam is limited to at most several percent of the current of charged particles absorbed by a conventional shaping aperture configured using a metal sheet. Hence, a shaping aperture according to this embodiment experiences much less heating than a conventional shaping aperture, thereby eliminating any need for an active cooling system for the shaping aperture. Also, temperature control of components near the shaping aperture is much simpler to perform than in conventional apparatus.

Charged particles that have been forward-scattered by the thin-film membrane of the shaping aperture are blocked by the screening aperture. Effective blocking is achieved by absorption of the forward-scattered charged particles by the relatively thick conductive sheet of the screening aperture (the conductive sheet can be, for example, 500 to 1000 $\mu$m thick), and by positioning the screening aperture at a crossover. Thus, the screening aperture prevents scattered charged particles from reaching the sensitive substrate.

By way of example, the charged particle beam can be an electron beam. In such an instance, the thin-film membrane desirably has a thickness that is 10 to 100 times a mean-free-path length of electrons in the thin-film membrane. With a thickness in this range, most of the electrons in the beam incident on the membrane pass through (with scattering) the membrane without being absorbed by the membrane.

The CPB optical system can include a first condenser lens and a second condenser lens situated at respective positions along the optical axis. The first condenser lens desirably is situated and configured to converge the charged particle beam, propagating from the CPB source, to form a "crossover" on the optical axis at a principal plane of the second condenser lens. The shaping aperture desirably is situated along the optical axis at the same position as the second condenser lens. The shaping aperture can be a beam-trimming aperture configured to determine an aperture angle of the charged particle beam emitted from the CPB source.

The system also can include a profile-shaping aperture situated downstream of the second condenser lens but upstream of the screening aperture. The profile-shaping aperture desirably comprises a conductive thin-film membrane defining an aperture opening that transmits at least a portion of the beam incident on the profile-shaping aperture.

The thin-film membrane scatters the charged particles of the beam incident on the membrane without absorbing the incident charged particles, so as to form a shaped beam propagating downstream of the profile-shaping aperture. The profile-shaping aperture can be situated at an axial position at which an image of a CPB-emitting surface of the CPB source is formed. This system also can include a third condenser lens situated downstream of the profile-shaping aperture and upstream of the screening aperture.

The shaping aperture can be a beam-trimming aperture configured to determine an aperture angle of the charged particle beam emitted from the CPB source. In such a configuration, if the charged particle beam is an electron beam, the thin-film membrane desirably has a thickness that is 10 to 100 times a mean-free-path length of electrons in the thin-film membrane. CPB optical systems in which the shaping aperture is a beam-trimming aperture also can include a first condenser lens and a second condenser lens situated at respective positions along the optical axis. The first condenser lens is situated and configured to converge the charged particle beam, propagating from the CPB source, to form a "crossover" on the optical axis at a principal plane of the second condenser lens. The system also can include a profile-shaping aperture, as described above, situated downstream of the second condenser lens but upstream of the screening aperture.

According to another aspect of the invention, CPB microlithography apparatus are provided. An exemplary embodiment of such an apparatus comprises an illumination-optical system comprising a CPB optical system as summarized above. The apparatus also includes a projection-optical system situated downstream of the illumination-optical system. The projection-optical system desirably comprises first and second projection lenses, and a contrast aperture situated axially at a beam crossover between the first and second projection lenses. The contrast aperture desirably includes a conductive sheet that defines an aperture opening corresponding to the beam crossover, the conductive sheet being sufficiently thick in an optical-axis direction so as to absorb charged particles incident on the sheet. The illumination-optical system desirably comprises a first condenser lens and a second condenser lens situated at respective positions along the optical axis. The first condenser lens desirably is situated and configured to converge the charged particle beam, propagating from the CPB source, to form a "crossover" on the optical axis at a principal plane of the second condenser lens. The shaping aperture desirably is situated along the optical axis at the same position as the second condenser lens. The shaping aperture can be a beam-trimming aperture configured to determine an aperture angle of the charged particle beam emitted from the CPB source. A profile-shaping aperture can be included, situated downstream of the second condenser lens but upstream of the screening aperture. If present, the profile-shaping aperture desirably is configured to include a conductive thin-film membrane defining an aperture opening that transmits at least a portion of the beam incident on the profile-shaping aperture. The thin-film membrane scatters the charged particles of the beam incident on the membrane without absorbing the incident charged particles, to form a shaped beam propagating downstream of the profile-shaping aperture.

According to yet another aspect of the invention, methods are provided for microlithographically exposing a pattern, defined by a reticle, onto a sensitive substrate. The methods are performed using a charged particle beam propagating from a source through an illumination-optical system to the reticle, and from the reticle through a projection-optical system to a sensitive substrate. In this context, the methods are directed especially to shaping the charged particle beam. In an embodiment of such a method, a shaping aperture is provided and situated so as to receive the charged particle beam. The shaping aperture comprises a thin-film membrane defining an aperture opening that transmits at least a portion of the charged particle beam incident on the shaping aperture. The thin-film membrane is configured to scatter the charged particles of the beam incident on the membrane without absorbing the incident charged particles. The charged particle beam is passed through the aperture opening of the shaping aperture to form a shaped beam propagating downstream of the shaping aperture. A screening aperture is provided and situated downstream of the shaping aperture at a location at which the shaped beam forms a crossover. The screening aperture comprises a conductive sheet defining an aperture opening having a width dimension corresponding to a width dimension of the crossover. The conductive sheet is sufficiently thick in an optical-axis direction so as to absorb charged particles incident on the sheet. The charged particle beam is passed through the aperture opening of the screening aperture.

The invention also encompasses CPB microlithography methods that comprise beam-shaping methods as summarized above, as well as device-manufacturing methods that comprising CPB microlithography methods as summarized above.

The foregoing and additional features and advantages of the invention will be more readily apparent from the following detailed description, which proceeds with reference to the accompanying drawings.

DETAILED DESCRIPTION

This invention is described below in the context of a representative embodiment. It will be understood, however, that the described embodiment is not intended to be limiting in any way.

Figure 1:
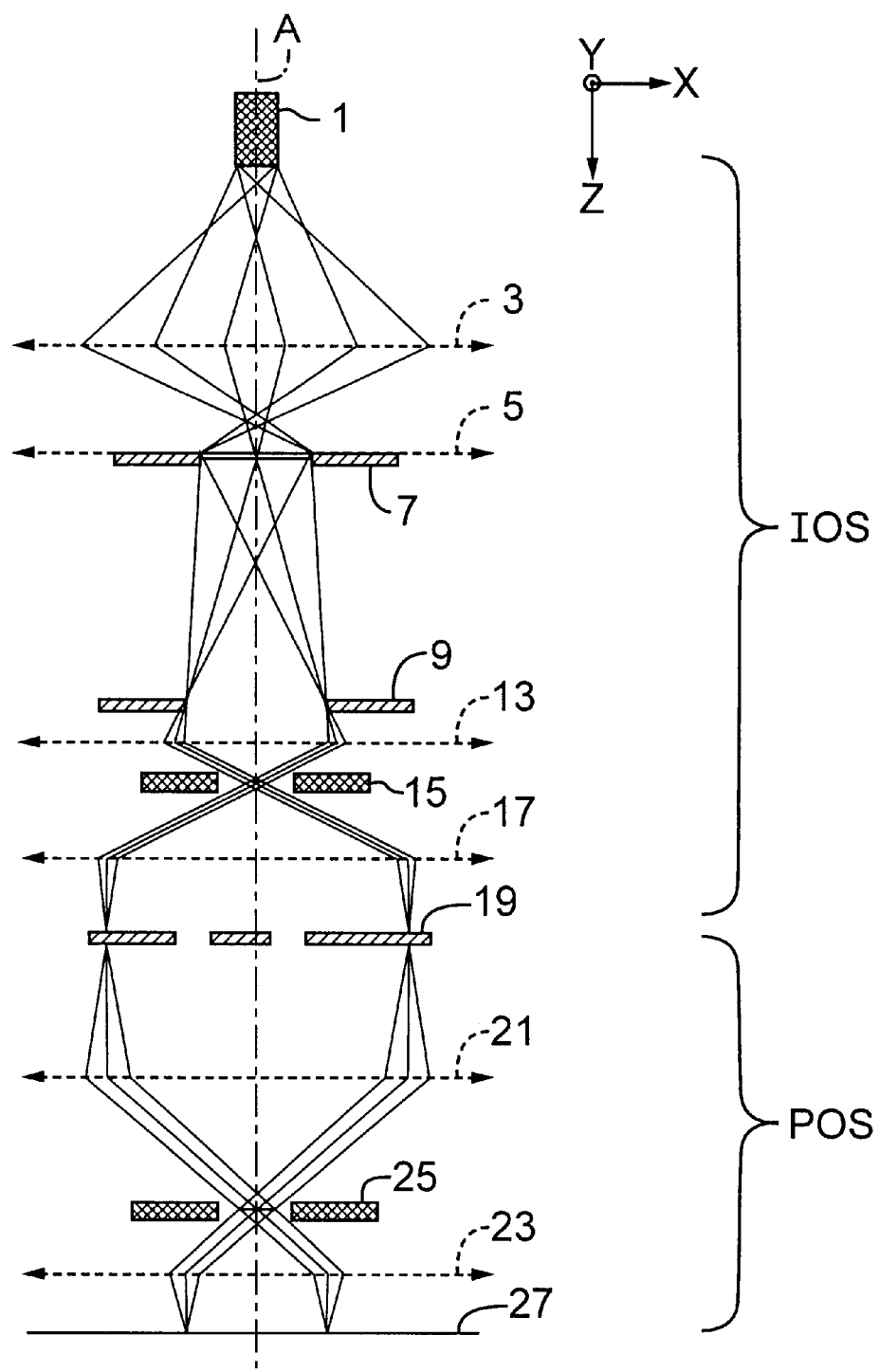
FIG. 1 is a schematic elevational diagram of an exemplary embodiment, according to the invention, of a charged-particle-beam (CPB) optical system as used in a CPB microlithography apparatus, wherein the CPB optical system includes both a beam-trimming aperture and a profile-shaping aperture (with screening aperture) according to the invention.

FIG. 1 is a schematic elevational diagram of an exemplary embodiment, according to the invention, of a charged-particle-beam (CPB) optical system configured for use in a CPB microlithography apparatus. The FIG. 1 apparatus is described in the context of employing an electron beam as a representative charged particle beam. It will be understood that the general principles of the FIG. 1 embodiment can be applied with equal facility to use of an alternative charged particle beam such as an ion beam.

The FIG. 1 apparatus includes an electron gun 1 situated at an extreme upstream end of the CPB optical system. The electron gun 1 emits an electron beam downward in the figure (i.e., the beam emitted from the electron gun propagates in a downstream direction). The electron beam as emitted from the electron gun 1 propagates along an optical axis A.

The FIG. 1 apparatus is configured for performing CPB microlithography, and hence comprises an "illumination-optical system" IOS and a "projection-optical system" POS. The illumination-optical system IOS is situated between the electron gun 1 and a "reticle" 19 that defines a pattern to be projected microlithographically onto a "sensitive substrate" 27 (e.g., semiconductor wafer coated with a suitable "resist"). The projection-optical system POS is situated between the reticle 19 and the substrate 27.

The illumination-optical system IOS comprises a first condenser lens 3, a second condenser lens 5, a beam-trimming aperture 7, a profile-shaping aperture 9, a third condenser lens 13, a "screening" aperture 15, and an illumination lens 17. The projection-optical system POS comprises a first projection lens 21, a contrast aperture 25, and a second projection lens 23.

Although this embodiment has both a beam-trimming aperture 7 and a profile-shaping aperture 9, in an alternative embodiment, the beam-trimming aperture 7 could be omitted.

The electron beam emitted from the electron gun 1 is converged by the first condenser lens 3 to form a "crossover" on the optical axis at the principal plane of the second condenser lens 5. The beam-trimming aperture 7 is situated at the same axial position as the second condenser lens 5. The beam-trimming aperture 7 typically defines a circular opening that transmits the beam, thereby determining the downstream aperture angle of the beam. The beam-trimming aperture 7 can be made from a thin, electrically conductive membrane of, e.g., silicon or the like.

The thickness of the membrane of the beam-trimming aperture 7 (i.e., the Z-dimension) generally is sufficient to cause charged particles, incident on the membrane, to be scattered rather than absorbed by the membrane. The membrane is also sufficiently thick to have adequate mechanical strength to provide adequate service as a beam-trimming aperture. For an incident beam of electrons, the membrane thickness typically is within the range of 10 to 100 times the length of the mean free path of electrons of the beam in the membrane material. By way of example, the mean free path of electrons in a silicon membrane is 150 nm for a 100 keV electron beam. Under such conditions, the thickness of the silicon beam-trimming aperture 7 can be about 2 $\mu$m.

At 2 $\mu$m thickness, the beam-trimming aperture 7 is configured as a "membrane." Because the membrane transmits (with scattering) incident charged particles, rather than absorbing the particles, the membrane experiences very little heating from impingement of incident charged particles. Hence, a beam-trimming aperture 7 configured as a membrane is not subject to thermal deformation.

The profile-shaping aperture 9 is disposed downstream of the second condenser lens 5 at an axial position at which an image of the electron-emission surface (cathode) of the electron gun 1 is formed. The profile-shaping aperture 9 defines the transverse profile of the electron-beam flux and determines the transverse sectional area of the beam illuminating a region on the reticle 19. The profile-shaping aperture 9 desirably is a membrane made of silicon or the like, similar to the beam-trimming aperture 7. With such a configuration, the profile-shaping aperture 9 does not exhibit significant temperature increases from impingement of incident charged particles. Hence, the profile-shaping aperture 9 is not subject to thermal deformation.

The third condenser lens 13 is disposed downstream of the profile-shaping aperture 9, and the screening aperture 15 is disposed at a crossover position downstream of the third condenser lens 13. The screening aperture 15 is fabricated from a sheet of metal, such as molybdenum or tantalum, desirably approximately 500 to 1000 $\mu$m thick. The screening aperture 15 functions in conjunction with the beam-trimming aperture 7 and/or profile-shaping aperture 9, and serves to block (by absorption) charged particles scattered by the beam-trimming aperture 7 and/or the beam-shaping aperture 9. By relegating the task of charged-particle absorption to the screening aperture 15 (which does not have to define an aperture opening accurately that otherwise would be deformed by heating), the beam-trimming and profile-shaping apertures are relieved of having to be subject to heating.

The illumination lens 17 is disposed downstream of the screening aperture 15. The electron beam passing through the illumination lens 17 forms an image of the profile-shaping aperture 9 on the reticle 19 situated downstream of the illumination lens 17.

The first and second projection lenses 21, 23, respectively, are disposed downstream of the reticle 19. The contrast aperture 25 is disposed at a crossover location between the projection lenses 21, 23. The contrast aperture 25, similar to the screening aperture 15, is fabricated from a sheet of metal, such as molybdenum or tantalum, desirably approximately 500 to 1000 $\mu$m thick. The contrast aperture 25 serves to block (by absorption) charged particles scattered by the membrane portion of the reticle 19. An image of the illuminated portion of the reticle 19 is formed, with demagnification, on a corresponding region of the substrate 27 by the first and second projection lenses 21, 23, respectively.

Although not described or shown herein, it will be understood that each of the illumination-optical system IOS and projection-optical system POS includes one or more deflectors and corrective coils as used for beam scanning, beam-position adjustment, and aberration control, for example.

Figure 2:
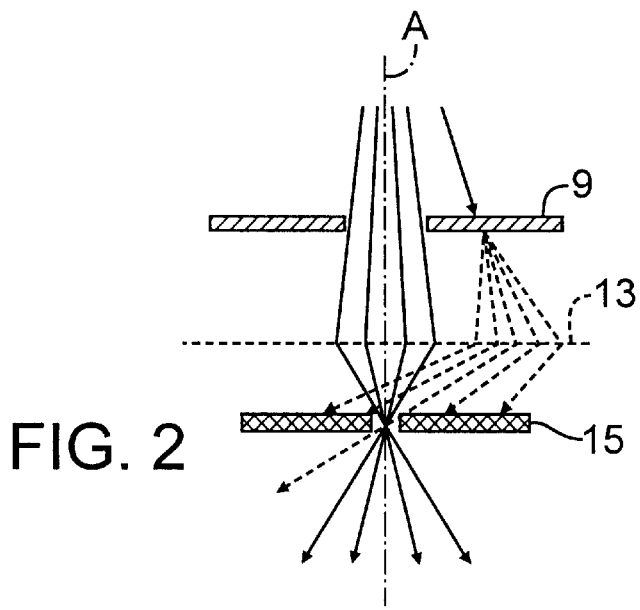
FIG. 2 is a schematic elevational diagram depicting absorption of charged particles, scattered by impingement on an upstream profile-shaping aperture, by a downstream screening aperture.

FIG. 2 is a schematic elevational diagram depicting absorption of charged particles, scattered by an upstream profile-shaping aperture, by the downstream screening aperture. The figure shows an enlargement of an area around the profile-shaping aperture 9, third condenser lens 13, and screening aperture 15.

The charged particle beam transmitted through the opening defined by the profile-shaping aperture 9 (representative trajectories of transmitted charged particles are denoted by the solid lines in the figure) are converged by the third condenser lens 13 for passage through the opening defined by the screening aperture 15. Meanwhile, charged particles impinging on the profile-shaping aperture 9 are scattered as they pass through the membrane of the profile-shaping aperture 9 (representative trajectories of scattered charged particles are denoted by the dashed lines in the figure). Most of the scattered charged particles are not converged sufficiently by the third condenser lens 13 for passage through the opening in the screening aperture 15. Rather, these scattered charged particles impinge on and are absorbed by the aperture plate of the screening aperture 15. By having the screening aperture 15, rather than the profile-shaping aperture 9, perform the task of particle absorption, the profile-shaping aperture 9 does not experience significant absorption-based heating.

FIGS. 3(a)–3(f) are schematic elevational diagrams showing the results of respective steps in an exemplary method for manufacturing a beam-trimming or profile-shaping aperture according to the invention. In a first step, a boron-doped oxide film 33D' and a silicon membrane layer 32A are laminated on a major surface (top surface in the figure) of a base substrate 31 (FIG. 3(a)). The base substrate 31 desirably is made of silicon. A film of silicon nitride (SiN) 35 is formed on the opposing major surface (bottom surface in the figure) of the base substrate 31. The SiN film 35 serves as a mask during later etching of the base substrate 31 from the bottom.

Figure 3A:
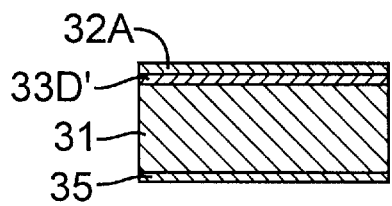
FIGS. 3(a)–3(f) are schematic elevational diagrams showing the results of respective steps in an exemplary method for manufacturing a beam-shaping aperture according to the invention.
Figure 3D:
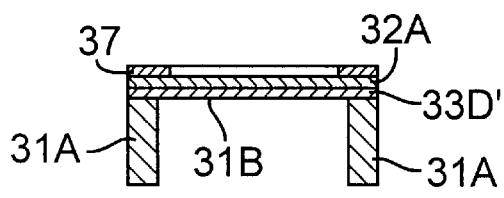
Figure 3B:
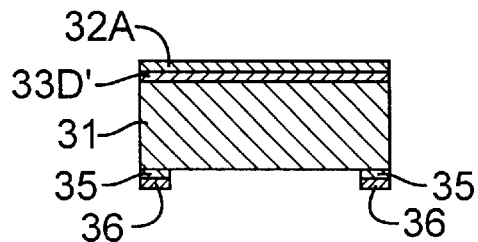
Figure 3E:
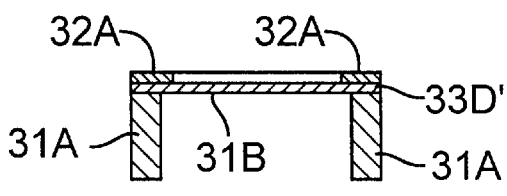
Figure 3C:
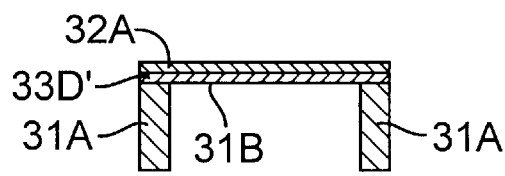

A resist film 36 is applied to the SiN film 35 (FIG. 3(b)). A pattern for forming support struts 31A in the base substrate 31 is exposed into the resist film 36 and the resist is developed. Using the developed resist film 36 as a mask, the SiN film 35 is dry etched as shown in the figure to form a corresponding pattern in the SiN film 35. The pattern defines the locations at which the support struts 31A will be formed.

Next, the base substrate 31 is wet-etched from its bottom surface ("back-etched") according to the pattern in the SiN film 35 to form the girder-like support struts 31A and a bilayer membrane consisting of the silicon membrane layer 32A and the boron-doped oxide layer 33D'. The support struts 31A support the bilayer membrane and form a membrane region 31B. The boron-doped oxide film 33D' is exposed in the membrane region 31B. The SiN film 35 and resist film 36 remaining at the "lower" ends of the support struts 31A (opposite from the boron-doped oxide film 33D') are stripped away (FIG. 3(c)).

A film of resist 37 is applied to the membrane layer 32A. A pattern defining the desired aperture opening (e.g., square) for the membrane layer 32A is exposed into the resist film 37, and the resist is developed (FIG. 3(d)).

The membrane layer 32A is dry-etched using the developed resist film 37 as a mask, thereby forming the respective aperture opening in the membrane layer 32A of the membrane region 31B. Remaining resist film 37 is stripped away (FIG. 3(e)).

Figure 3F:
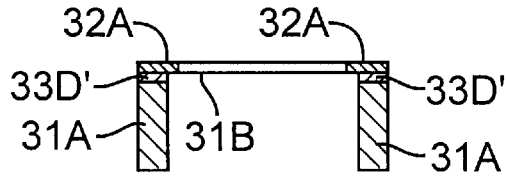

The boron-doped oxide film 33D' is removed in the membrane region 31B using hydrofluoric acid, thereby completing fabrication of the beam-shaping aperture (FIG. 3(f)).

By making the beam-trimming and profile-shaping apertures from respective thin films according to the invention, absorption of CPB beam current by these apertures is reduced to at most several percent of the absorption that otherwise would be exhibited by a beam-trimming or profile-shaping aperture made of a relatively thick sheet of metal. As a result, the need to perform active cooling of the beam-trimming or profile-shaping aperture(s) in a CPB optical system according to the invention is eliminated, resulting in simplification and cost reduction of the overall system. Also, control of the temperature of components surrounding the beam-trimming and profile-shaping apertures is simplified. In addition, because charged particles forward-scattered from the beam-trimming or profile-shaping aperture are blocked by a downstream metal screening aperture, the scattered charged particles are prevented from reaching the substrate, thereby achieving maximal image contrast on the substrate.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. A charged-particle-beam (CPB) optical system, comprising:
   a shaping aperture situated and configured to receive a beam of charged particles propagating along an optical axis from a CPB source, the shaping aperture comprising a conductive thin-film membrane defining an aperture opening that transmits at least a portion of the beam incident on the shaping aperture and forms a shaped beam propagating downstream of the shaping aperture, the thin-film membrane scattering the charged particles of the beam incident on the membrane without absorbing the incident charged particles, such that the shaped beam and scattered charged particles propagate downstream of the shaping aperture; and
   a screening aperture situated downstream of the shaping aperture at a location at which the shaped beam forms a crossover, the screening aperture comprising a conductive sheet defining an aperture opening having a width dimension corresponding to a width dimension of the crossover so as to allow the shaped beam to pass through the aperture opening, the conductive sheet being sufficiently thick in an optical-axis direction so as to absorb charged particles, including charged particles scattered during transmission through the conductive thin-film membrane of the shaping aperture, incident on the sheet.

2. The system of claim 1, wherein:
   the charged particle beam is an electron beam; and
   the thin-film membrane has a thickness that is 10 to 100 times a mean-free-path length of electrons in the thin-film membrane.

3. The system of claim 2, wherein the conductive sheet of the screening aperture is 500 to 1000 μm thick.

4. The system of claim 1, further comprising a first condenser lens and a second condenser lens situated at respective positions along the optical axis, wherein:
   the first condenser lens is situated and configured to converge the charged particle beam, propagating from the CPB source, to form a "crossover" on the optical axis at a principal plane of the second condenser lens; and
   the shaping aperture is situated along the optical axis at the same position as the second condenser lens.

5. The system of claim 4, wherein the shaping aperture is a beam-trimming aperture configured to determine an aperture angle of the charged particle beam emitted from the CPB source.

6. The system of claim 5, further comprising a profile-shaping aperture situated downstream of the second condenser lens but upstream of the screening aperture, the profile-shaping aperture comprising a conductive thin-film membrane defining an aperture opening that transmits at least a portion of the beam incident on the profile-shaping aperture, the thin-film membrane scattering the charged particles of the beam incident on the membrane without absorbing the incident charged particles, to form a shaped beam propagating downstream of the profile-shaping aperture.

7. The system of claim 6, wherein the profile-shaping aperture is situated at an axial position at which an image of a CPB-emitting surface of the CPB source is formed.

8. The system of claim 7, further comprising a third condenser lens situated downstream of the profile-shaping aperture and upstream of the screening aperture.

9. The system of claim 1, wherein the shaping aperture is a beam-trimming aperture configured to determine an aperture angle of the charged particle beam emitted from the CPB source.

10. The system of claim 9, wherein:
   the charged particle beam is an electron beam; and
   the thin-film membrane has a thickness that is 10 to 100 times a mean-free-path length of electrons in the thin-film membrane.

11. The system of claim 10, wherein the conductive sheet of the screening aperture is 500 to 1000 µm thick.

12. The system of claim 10, further comprising a first condenser lens and a second condenser lens situated at respective positions along the optical axis, wherein the first condenser lens is situated and configured to converge the charged particle beam, propagating from the CPB source, to form a "crossover" on the optical axis at a principal plane of the second condenser lens.

13. The system of claim 12, further comprising a profile-shaping aperture situated downstream of the second condenser lens but upstream of the screening aperture, the profile-shaping aperture comprising a conductive thin-film membrane defining an aperture opening that transmits at least a portion of the beam incident on the profile-shaping aperture, the thin-film membrane scattering the charged particles of the beam incident on the membrane without absorbing the incident charged particles, to form a shaped beam propagating downstream of the profile-shaping aperture.

14. A charged-particle-beam (CPB) microlithography apparatus, comprising:
   an illumination-optical system comprising the CPB optical system of claim 1; and
   a projection-optical system situated downstream of the illumination-optical system.

15. The CPB microlithography apparatus of claim 14, wherein:
   the projection-optical system comprises first and second projection lenses, and a contrast aperture situated axially at a beam crossover between the first and second projection lenses; and
   the contrast aperture comprises a conductive sheet defining an aperture opening corresponding to the beam crossover, the conductive sheet being sufficiently thick in an optical-axis direction so as to absorb charged particles incident on the sheet.

16. The CPB microlithography apparatus of claim 14, wherein:
   the illumination-optical system comprises a first condenser lens and a second condenser lens situated at respective positions along the optical axis, wherein the first condenser lens is situated and configured to converge the charged particle beam, propagating from the CPB source, to form a "crossover" on the optical axis at a principal plane of the second condenser lens; and
   the shaping aperture is situated along the optical axis at the same position as the second condenser lens.

17. The CPB microlithography apparatus of claim 16, wherein the shaping aperture is a beam-trimming aperture configured to determine an aperture angle of the charged particle beam emitted from the CPB source.

18. The CPB microlithography apparatus of claim 17, further comprising a profile-shaping aperture situated downstream of the second condenser lens but upstream of the screening aperture, the profile-shaping aperture comprising a conductive thin-film membrane defining an aperture opening that transmits at least a portion of the beam incident on the profile-shaping aperture, the thin-film membrane scattering the charged particles of the beam incident on the membrane without absorbing the incident charged particles, to form a shaped beam propagating downstream of the profile-shaping aperture.

19. In a method for microlithographically exposing a pattern, defined by a reticle, onto a sensitive substrate using a charged particle beam propagating from a source through an illumination-optical system to the reticle, and from the reticle through a projection-optical system to a sensitive substrate, a method for shaping the charged particle beam, comprising:
   situating a shaping aperture so as to receive the charged particle beam, the shaping aperture comprising a thin-film membrane defining an aperture opening that transmits at least a portion of the charged particle beam incident on the shaping aperture, and the thin-film membrane being configured to scatter the charged particles of the beam incident on the membrane without absorbing the incident charged particles, thereby allowing the scattered charged particles to propagate downstream of the shaping aperture;
   passing the charged particle beam through the aperture opening of the shaping aperture to form a shaped beam propagating downstream of the shaping aperture;
   situating a screening aperture downstream of the shaping aperture at a location at which the shaped beam forms a crossover, the screening aperture comprising a conductive sheet defining an aperture opening having a width dimension corresponding to a width dimension of the crossover so as to allow the shaped beam to pass through the aperture opening, the conductive sheet being sufficiently thick in an optical-axis direction so as to absorb charged particles incident on the sheet; and
   passing the charged particle beam through the aperture opening of the screening aperture while absorbing charged particles, including charged particles scattered during transmission through the thin-film membrane of the shaping aperture, incident on the conductive sheet of the screening aperture.

20. A CPB microlithography method, comprising:
   in an illumination-optical system directing a charged-particle illumination beam to a shaping aperture comprising a thin-film membrane defining an aperture opening that transmits at least a portion of the illumination beam incident on the shaping aperture, the thin-film membrane being configured to scatter charged particles of the illumination beam incident on the membrane without absorbing the incident charged particles;
   passing the illumination beam through the aperture opening of the shaping aperture to form a shaped beam propagating downstream of the shaping aperture along with charged particles scattered by passage through the thin-film membrane of the shaping aperture;
   causing the shaped beam to form a crossover downstream of the shaping aperture;
   at the crossover causing the shaped beam to be incident on a screening aperture comprising a conductive sheet defining an aperture opening and being sufficiently thick so as to absorb charged particles incident on the sheet;
   passing the shaped illumination beam through the aperture opening of the screening aperture while absorbing scattered charged particles incident on the sheet, thereby blocking propagation of the scattered charged particles downstream of the screening aperture;

directing the shaped illumination beam to a selected region on a pattern-defining reticle; and passing the charged particle beam, that has passed through the reticle, through a projection-optical system to a sensitive substrate.

21. A device-manufacturing method, comprising:

defining a pattern on a reticle; and using a charged particle beam, transferring the pattern from the reticle to a sensitive substrate using a microlithography method comprising the steps of (1) in an illumination-optical system directing a charged-particle illumination beam to a shaping aperture comprising a thin-film membrane defining an aperture opening that transmits at least a portion of the illumination beam incident on the shaping aperture, the thin-film membrane being configured to scatter charged particles of the illumination beam incident on the membrane without absorbing the incident charged particles;

(2) passing the illumination beam through the aperture opening of the shaping aperture to form a shaped beam propagating downstream of the shaping aperture along with charged particles scattered by passage through the thin-film membrane of the shaping aperture;

(3) causing the shaped beam to form a crossover downstream of the shaping aperture;

(4) at the crossover causing the shaped beam to be incident on a screening aperture comprising a conductive sheet defining an aperture opening and being sufficiently thick so as to absorb charged particles incident on sheet;

(5) passing the shaped illumination beam through the aperture opening of the screening aperture while absorbing scattered charged particles incident on the sheet, thereby blocking propagation of the scattered charged particles downstream of the screening aperture;

(6) directing the shaped illumination beam to a selected region on the reticle; and (7) passing the charged particle beam, that has passed through the reticle, through a projection-optical system to the sensitive substrate.

* * * * *